(12) United States Patent
Li et al.

(10) Patent No.: US 10,743,415 B2
(45) Date of Patent: Aug. 11, 2020

(54) CAMERA MODULE WITH REDUCED LIGHT LEAKAGE AND ELECTRONIC DEVICE USING SAME

(71) Applicant: TRIPLE WIN TECHNOLOGY(SHENZHEN) CO. LTD., Shenzhen (CN)

(72) Inventors: Jing-Wei Li, Guangdong (CN); Shin-Wen Chen, New Taipei (TW); Yu-Shuai Li, Shenzhen (CN); Sheng-Jie Ding, Guangdong (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/288,998

(22) Filed: Feb. 28, 2019

(65) Prior Publication Data
US 2020/0120801 A1 Apr. 16, 2020

(30) Foreign Application Priority Data
Oct. 15, 2018 (CN) .......................... 2018 1 1199182

(51) Int. Cl.
| | |
|---|---|
| H05K 1/00 | (2006.01) |
| H05K 1/14 | (2006.01) |
| H05K 1/18 | (2006.01) |
| H04N 5/225 | (2006.01) |

(52) U.S. Cl.
CPC ............ *H05K 1/148* (2013.01); *H04N 5/2254* (2013.01); *H05K 1/145* (2013.01); *H05K 1/181* (2013.01); *H05K 2201/10121* (2013.01)

(58) Field of Classification Search
USPC ......................................................... 361/749
See application file for complete search history.

(56) References Cited

U.S. PATENT DOCUMENTS

2009/0152731 A1* 6/2009 Inoue ................ H01L 23/49838
257/773

FOREIGN PATENT DOCUMENTS

| CN | 207075047 | * | 3/2018 |
| CN | 207075047 U | | 3/2018 |

* cited by examiner

*Primary Examiner* — Andargie M Aychillhum
(74) *Attorney, Agent, or Firm* — ScienBiziP, P.C.

(57) ABSTRACT

A camera module has a reduced light leakage. The camera module includes a printed circuit board and a mounting bracket mounted on the printed circuit board. The printed circuit board includes a first surface and at least one side surface perpendicularly connected to the first surface. Gaps are formed on the printed circuit board. The gaps extend from the first surface to a thickness direction of the first surface. Bumps are formed on the mounting bracket and correspondingly placed according to the gaps. Each of the bumps is received and fixed in a corresponding one of the gaps.

20 Claims, 6 Drawing Sheets

CAMERA MODULE WITH REDUCED LIGHT LEAKAGE AND ELECTRONIC DEVICE USING SAME

FIELD

The subject matter of the application generally relates to cameras.

BACKGROUND

Consumers expect reliability and quality constantly.

Most camera modules have a lens, a motor, a filter, a sensor chip, a base, and a circuit board. Currently, the base is mounted to the circuit board by optical adhesives. However, selections of the materials of optical adhesives are restricted, as the adhesives must meet miniaturization requirements, such as width, thickness, and optical properties. The optical adhesives also have to meet strength and other requirements of the camera module.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
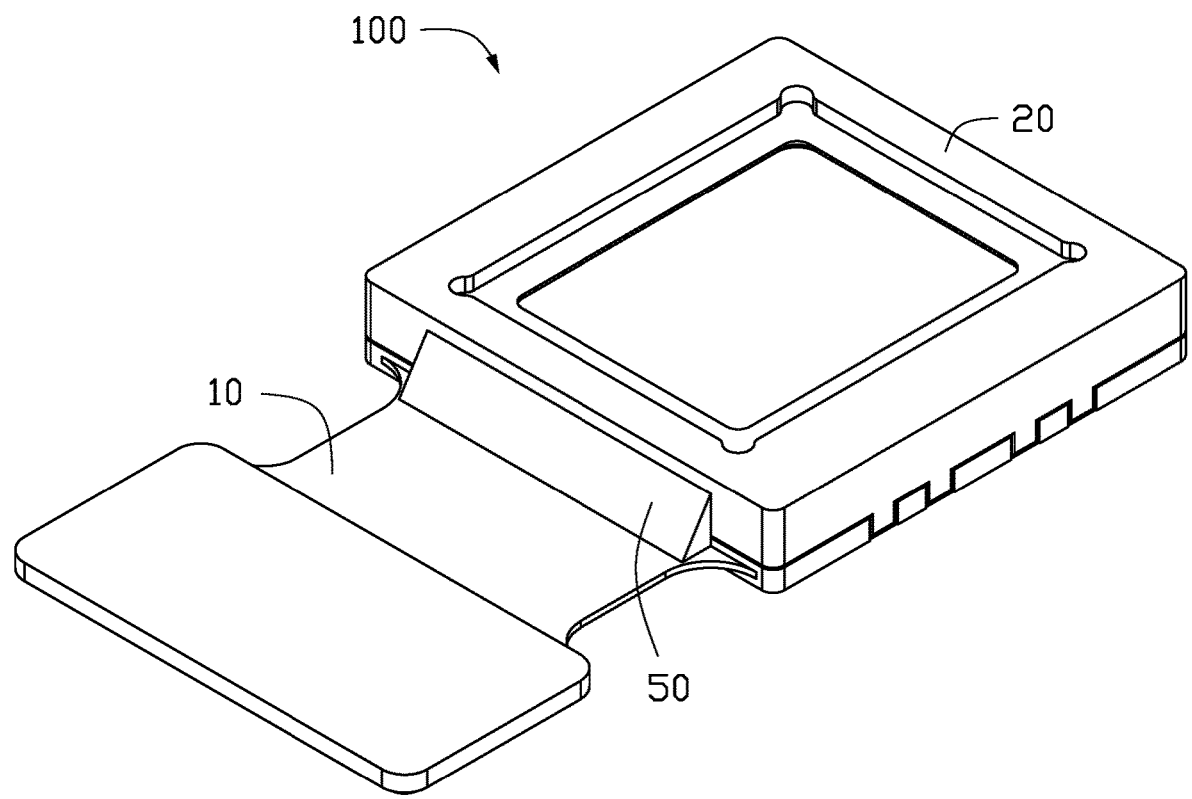
FIG. 1 is a perspective view of a first embodiment of a camera module according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
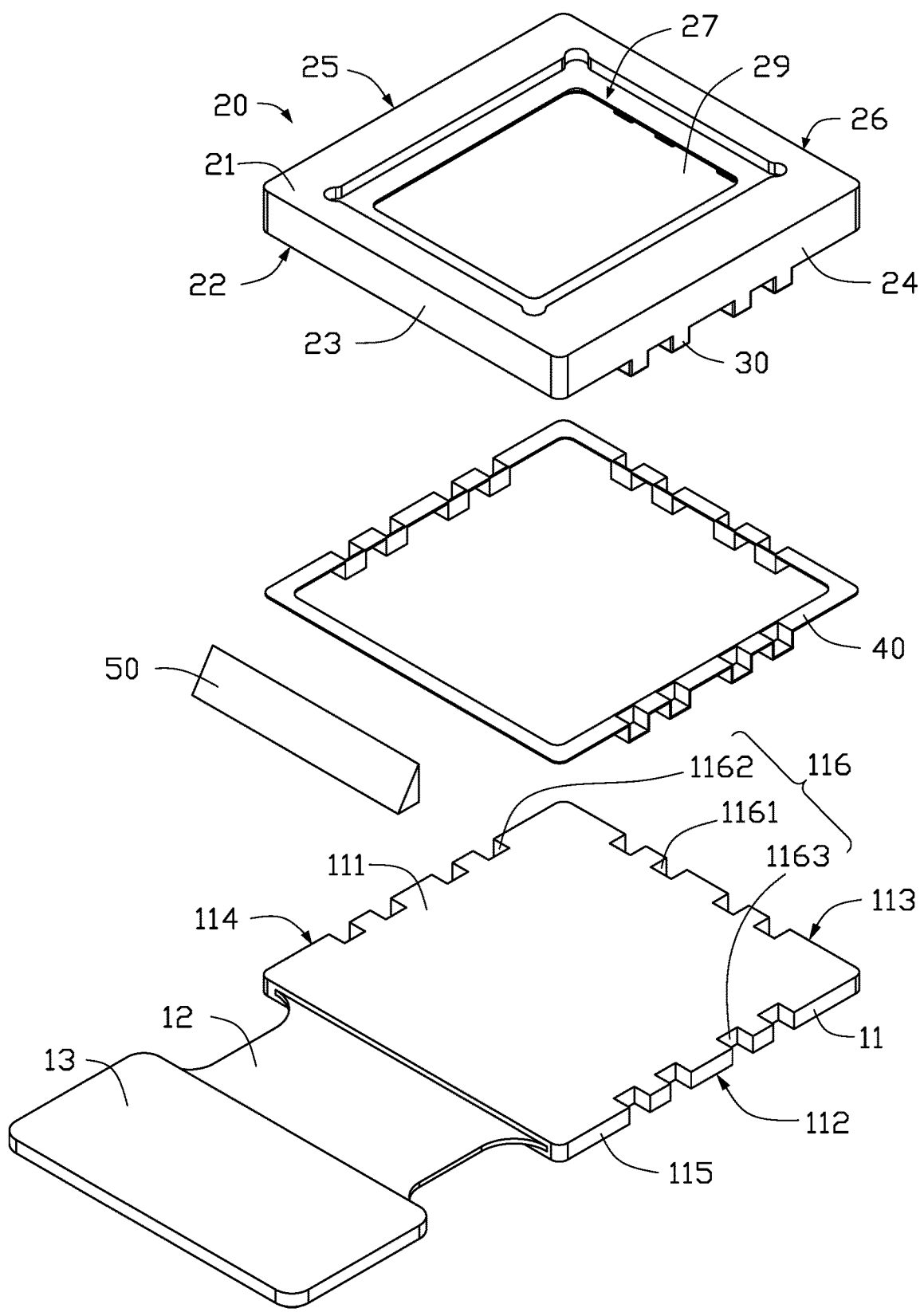
FIG. 2 is a view of the opened camera module of FIG. 1.
Figure 3:
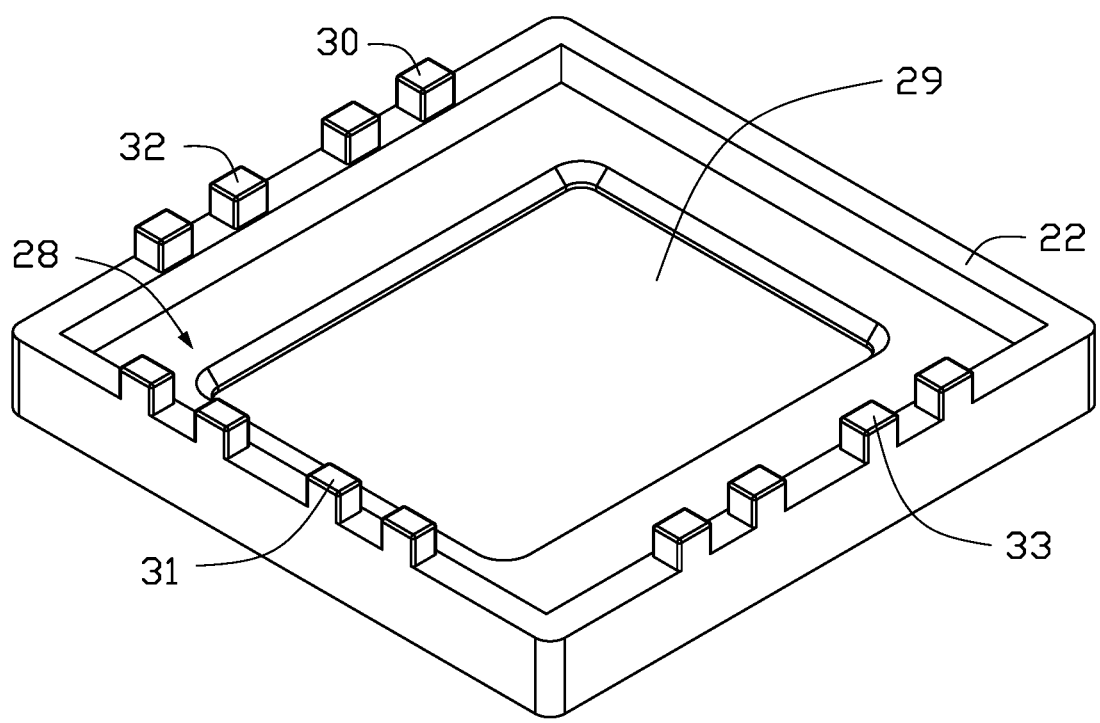
FIG. 3 is a perspective view of a base of the camera module of FIG. 2 from another angle.

FIGS. 1-3 show a camera module 100. The camera module 100 includes a printed circuit board 10, a mounting bracket 20, a lens (not shown), an optical filter (not shown), and a sensor (not shown). The mounting bracket 20 is mounted on the printed circuit board 10 by an adhesive layer 40. The lens is mounted on the mounting bracket 20. The optical filter is received in the mounting bracket 20 and faces the lens. The sensor is mounted on the printed circuit board 10 and faces the optical filter.

The printed circuit board 10 may be a ceramic substrate, a flexible printed circuit board, a rigid printed circuit board, a rigid-flex printed circuit board, or the like. In at least one embodiment, the printed circuit board 10 is a rigid-flex printed circuit board.

In at least one embodiment, the printed circuit board 10 includes a first rigid portion 11, a second rigid portion 12, and a flexible portion 13. The flexible portion 13 is located between the first rigid portion 11 and the second rigid portion 12. The sensor and the mounting bracket 20 are mounted on the first rigid portion 11.

The first rigid portion 11 includes a first surface 111, a second surface 112, a first side surface 113, a second side surface 114, and a third side surface 115. The second surface 112 is opposite to the first surface 111. The first side surface 113 is perpendicularly connected to each of the first surface 111 and the second surface 112. The second side surface 114 is perpendicularly connected to each of the first surface 111, the second surface 112, and the first side surface 113. The third side surface 115 is opposite to the second side surface 114. The sensor is mounted on the first surface 111 of the first rigid portion 11. The mounting bracket 20 is mounted on the first surface 111 of the first rigid portion 11 by the adhesive layer 40.

Gaps 116 are formed on the first rigid portion 11. The gaps 116 are located at the peripheral edges of the first rigid portion 11. The gaps 116 extend from the first surface 111 to the second surface 112. In at least one embodiment, the gaps 116 pass through the first surface 111 but not through the second surface 112, that is, the gaps 116 pass through the first rigid portion 11 of the printed circuit board 10. In at least one embodiment, the gaps 116 include a group of first gaps 1161, a group of second gaps 1162, and a group of third gaps 1163. The first gaps 1161 abut the first side surface 113. The second gaps 1162 abut the second side surface 114. The third gaps 1163 abut the third side surface 115.

In at least one embodiment, the mounting bracket 20 is substantially square. The mounting bracket 20 includes a third surface 21, a fourth surface 22, a fourth side surface 23, a fifth side surface 24, a sixth side surface 25, and a seventh side surface 26. The third surface 21 is parallel with the first surface 111. The fourth surface 22 is opposite to the third surface 21. The fourth side surface 23 is parallel with the first side surface 113 and is perpendicularly connected to each of the third surface 21 and the fourth surface 22. The fifth side surface 24 is perpendicularly connected to each of the third surface 21, the fourth surface 22, and the fourth side surface 23. The sixth side surface 25 is opposite to the fourth side surface 23. The seventh side surface 26 is opposite to the fifth side surface 24.

A first receiving groove 27 is defined on the third surface 21. The first receiving groove 27 passes through the third surface 21 but does not pass through the fourth surface 22. The first receiving groove 27 receives the lens.

Referring to FIG. 3, a second receiving groove 28 is defined on the fourth surface 22. The second receiving groove 28 is opposite to the first receiving groove 27 and connects to the first receiving groove 27 via an opening 29.

The second receiving groove 28 has an area greater than that of the first receiving groove 27. The first receiving groove 27 has an area greater than that of the opening 29. The second receiving groove 28 receives the sensor and the optical filter.

Bumps 30 are formed on the fourth surface 22 of the mounting bracket 20. The bumps 30 are formed on the peripheral edges of the fourth surface 22 of the mounting bracket 20. In at least one embodiment, the bumps 30 include a group of first bumps 31, a group of second bumps 32, and a group of third bumps 33. The first bumps 31 abut the fourth side surface 23, the second bumps 32 abut the fifth side surface 24, and the third bumps 33 abut the seventh side surface 26. The first bumps 31 correspond to the first gaps 1161, the second bumps 32 correspond to the second gaps 1162, and the third bumps 33 correspond to the third gaps 1163. Each bump 30 is received and fixed in a corresponding gap 116.

In at least one embodiment, the bumps 30 abut three side surfaces (the fourth side surface 23, the fifth side surface 24, and the seventh side surface 26) of the mounting bracket 20. In another embodiment, one group of bumps is provided, the group of bumps abuts one side surface of the mounting bracket 20. In another embodiment, two groups of bumps are provided, each group of bumps abuts one side surface of the mounting bracket 20.

A number of the bumps 30 is same as a number of the gaps 116. In at least one embodiment, there are 12 bumps 30 and 12 gaps 116.

In at least one embodiment, the bumps 30 are integrally formed with the mounting bracket 20. In other embodiments, the bumps 30 can formed on the mounting bracket 20 by adhesive, screws, or the like.

In at least one embodiment, the surface of the bumps 30 abutting the fourth side surface 23 is flush with the fourth side surface 23, the surface of the bumps 30 abutting the fifth side surface 24 is flush with the fifth side surface 24, and the surface of the bumps 30 abutting the seventh side surface 26 is flush with the seventh side surface 26. In other embodiments, the surface of the bumps 30 is not flush with the fourth side surface 23, the fifth side surface 24, and the seventh side surface 26.

The adhesive layer 40 is formed on the bumps 30 and the third surface 21 without any bumps 30. The kind or type of the adhesive layer 40 is not limited. That is, the adhesive layer 40 can be an ordinary optical adhesive.

The bumps 30 and the gaps 116 enhance the mechanical strength of the camera module 100 and reduce light leakage from the camera module 100.

The camera module 100 further includes a reinforced adhesive 50. The reinforced adhesive 50 is mounted on the sixth side surface 25 of the mounting bracket 20 and the first surface 111 of the printed circuit board 10. The reinforced adhesive 50 also enhances the mechanical strength of the camera module 100.

In at least one embodiment, the reinforced adhesive 50 is an ultraviolet (UV) curable and reinforced adhesive. In other embodiment, the reinforced adhesive 50 also can be a heat-conducting adhesive to enhance the heat dissipation from the camera module 100.

Figure 4:
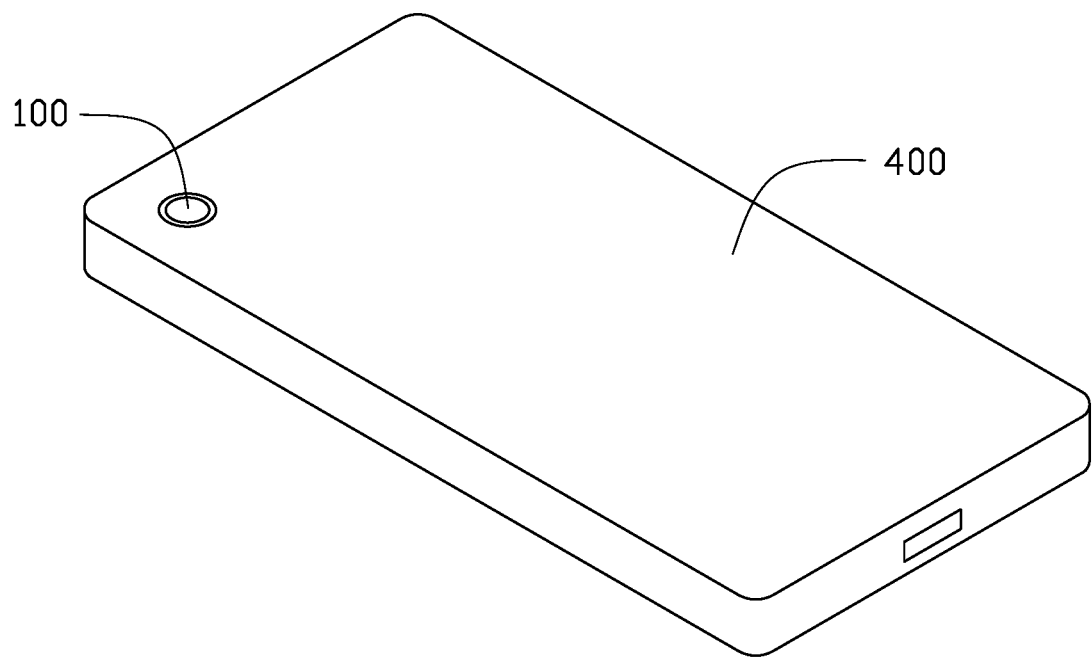
FIG. 4 is a perspective view of an electronic device including the camera module of FIG. 1.

In FIG. 4, the camera module 100 is applied to an electronic device 400. The electronic device 400 may be a smart phone, a tablet computer, or the like.

Figure 5:
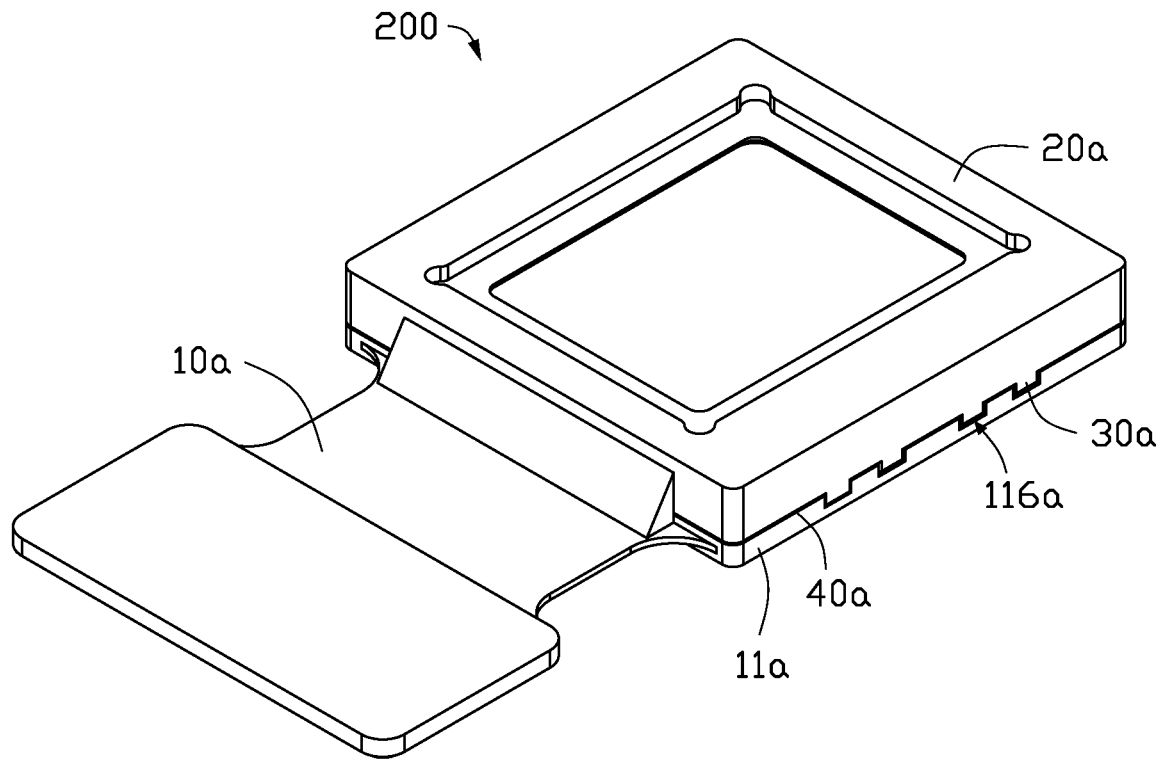
FIG. 5 is a perspective view of a second embodiment of a camera module according to the present disclosure.

FIG. 5 illustrates another embodiment, camera module 200. The camera module 200 has a similar structure to that of the camera module 100. The difference between the camera module 200 and the camera module 100 is that the gaps 116a do not pass through the first rigid portion 11a of the printed circuit board 10a. That is, the surface of the bumps 30 paralleling with the first surface 111a of the first rigid portion 11a is connected to the gaps 116a by the adhesive layer 40a.

Figure 6:
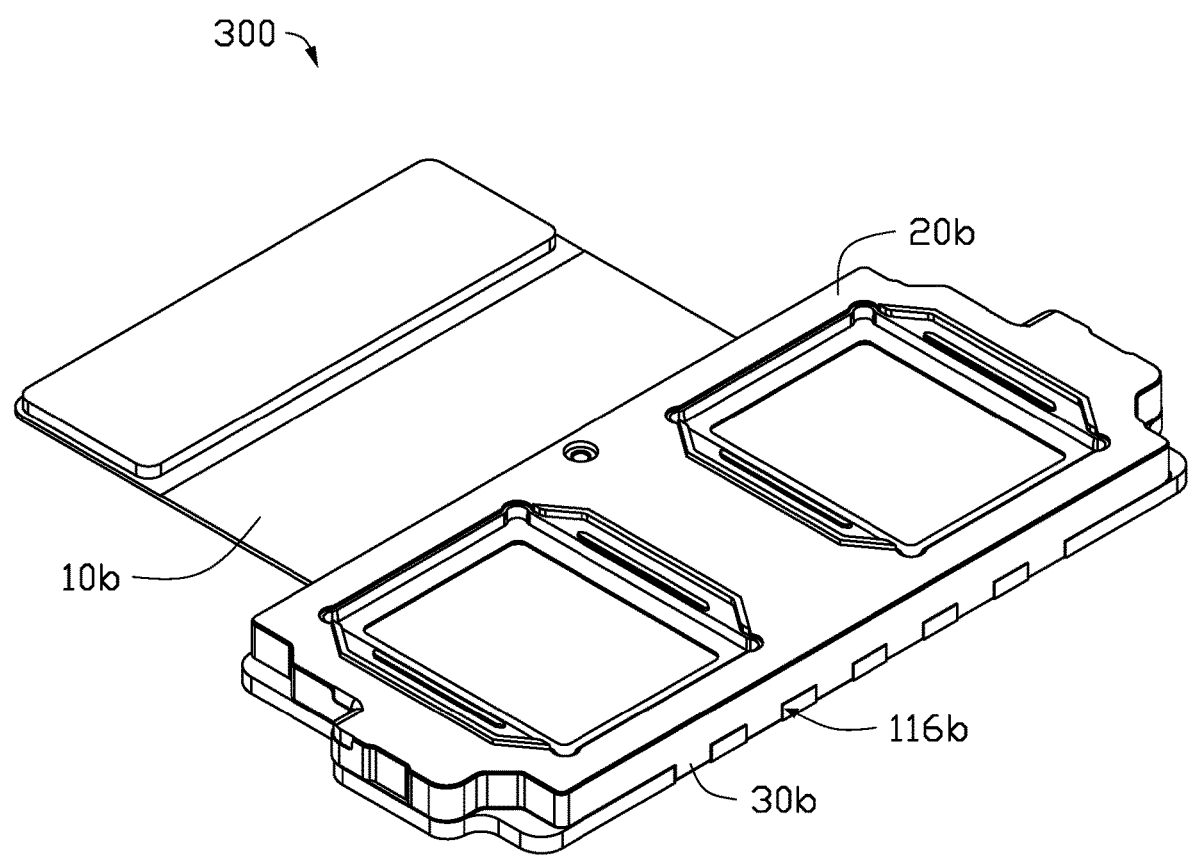
FIG. 6 is a perspective view of another embodiment of a camera module according to the present disclosure.

FIG. 6 illustrates another embodiment, camera module 300. The camera module 300 has a similar structure to that of the camera module 100. The difference between the camera module 300 and the camera module 100 is that the mounting bracket 20b of the camera module 300 can mount multiple lenses. In at least one embodiment, the mounting bracket 20b of the camera module 300 mounts two lenses. In at least one embodiment, the gaps 116b pass through or do not pass through the first rigid portion 11a of the printed circuit board 10a.

In other embodiments, the gaps 116b are continuous to form a step, the bumps 30b are continuous to form a single bump, and the single bump is fixed on the step by adhesive layer. The step passes through or does not pass through the first rigid portion 11b of the printed circuit board 10b.

In the embodiments described above, bumps are formed on the fourth surface of the mounting bracket, gaps corresponding to the bumps are formed on the first rigid portion, and the bumps are received and fixed in the gaps by the adhesive layer. This dovetailed arrangement enhances the mechanical strength of the camera module 100, the camera module 100 thus has reduced light leakage, and the characteristics of the type or kind of adhesive are less strict for use in the adhesive layer, thereby expanding the kinds of adhesive layer to be applied in camera modules and reducing the cost of camera modules.

The embodiments shown and described above are only examples. Many details are often found in the art such as the other features of a camera module and an electronic device. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A camera module with reduced light leakage comprising:
   a printed circuit board, the printed circuit board comprising a first surface and at least one side surface perpendicularly connected to the first surface; gaps being defined in the printed circuit board, the gaps extending from the first surface to a thickness direction of the first surface;
   a mounting bracket mounted on the printed circuit board; and
   bumps on the mounting bracket, wherein each of the bumps is received and fixed in a corresponding one of the gaps of the printed circuit board.

2. The camera module with reduced light leakage of claim 1, wherein the printed circuit board further comprises a second surface opposite to the first surface, the gaps pass through the second surface.

3. The camera module with reduced light leakage of claim 2, wherein each of the bumps is received and fixed in the corresponding gap by an adhesive layer, the adhesive layer is formed between a side surface of the bump perpendicular to the printed circuit board and an inner surface of the gap facing the side surface of the bump.

4. The camera module with reduced light leakage of claim 1, wherein the printed circuit board further comprises a second surface opposite to the first surface, the gaps do not pass through the second surface.

5. The camera module with reduced light leakage of claim 4, wherein each of the bumps is received and fixed in the corresponding gap by an adhesive layer, the adhesive layer covers the bumps.

6. The camera module with reduced light leakage of claim 1, wherein the printed circuit board comprises a first rigid portion, the first rigid portion comprises a second surface, a first side surface, a second side surface, and a third side surface; the second surface is opposite to the first surface, the first side surface is perpendicularly connected to each of the first surface and the second surface, the second side surface is perpendicularly connected to each of the first surface, the second surface, and the first side surface, the third side surface is opposite to the second side surface; the gaps abut the first side surface, the second side surface, and the third side surface.

7. The camera module with reduced light leakage of claim 1, wherein at least one first receiving groove is defined in the mounting bracket, the at least one first receiving groove is configured to receive at least one lens.

8. The camera module with reduced light leakage of claim 7, wherein a second receiving groove is defined in the mounting bracket, the second receiving groove is opposite to the first receiving groove and connected to the first receiving groove via an opening.

9. The camera module with reduced light leakage of claim 8, wherein the second receiving groove is configured to receive an optical filter and a sensor, the sensor is mounted on the printed circuit board, the optical filter is positioned between the lens and the sensor.

10. The camera module with reduced light leakage of claim 1, wherein the camera module with reduced light leakage further comprises a reinforced adhesive; the reinforced adhesive is mounted on the mounting bracket and the printed circuit board.

11. The camera module with reduced light leakage of claim 1, wherein the gaps are continuously connected to form a step, the bumps are continuously connected to form a single bump, and the single bump is fixed on the step via an adhesive layer.

12. The camera module with reduced light leakage of claim 11, wherein the step extends perpendicularly from one surface of the printed circuit board to another surface of the printed circuit board or does not extend perpendicularly from one surface of the printed circuit board to another surface of the printed circuit board.

13. An electronic device, comprising:
a camera module, comprising:
a printed circuit board, the printed circuit board comprising a first surface and at least one side surface perpendicularly connected to the first surface; gaps being defined in the printed circuit board, the gaps extending from the first surface to a thickness direction of the first surface;
a mounting bracket mounted on the printed circuit board; and
bumps on the mounting bracket; wherein each of the bumps is received and fixed in a corresponding one of the gaps of the printed circuit board.

14. The electronic device of claim 13, wherein the printed circuit board further comprises a second surface opposite to the first surface, the gaps pass through the second surface.

15. The electronic device of claim 14, wherein each of the bumps is received and fixed in the corresponding gap by an adhesive layer, the adhesive layer is formed between a side surface of the bump perpendicular to the printed circuit board and an inner surface of the gap facing the side surface of the bump.

16. The electronic device of claim 13, wherein the printed circuit board further comprises a second surface opposite to the first surface, the gaps do not pass through the second surface.

17. The electronic device of claim 16, wherein each of the bumps is received and fixed in the corresponding gap by an adhesive layer, the adhesive layer covers the bumps.

18. The electronic device of claim 13, wherein the printed circuit board comprises a first rigid portion, the first rigid portion comprises a second surface, a first side surface, a second side surface, and a third side surface; the second surface is opposite to the first surface, the first side surface is perpendicularly connected to each of the first surface and the second surface, the second side surface is perpendicularly connected to each of the first surface, the second surface, and the first side surface, the third side surface is opposite to the second side surface; the gaps abut the first side surface, the second side surface, and the third side surface.

19. The electronic device of claim 13, wherein at least one first receiving groove is defined in the mounting bracket, the at least one first receiving groove is configured to receive at least one lens.

20. The electronic device of claim 19, wherein a second receiving groove is defined in the mounting bracket, the second receiving groove is opposite to the first receiving groove and connects to the first receiving groove via an opening.

* * * * *